(12) United States Patent
Baumeister et al.

(10) Patent No.: US 6,599,843 B2
(45) Date of Patent: Jul. 29, 2003

(54) IN-SITU MASK TECHNIQUE FOR PRODUCING III-V SEMICONDUCTOR COMPONENTS

(75) Inventors: Horst Baumeister, Munich (DE); Roland Gessner, Geretsried 1 (DE); Eberhard Veuhoff, Ottobrunn (DE); Gundolf Wenger, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/867,290

(22) Filed: May 29, 2001

(65) Prior Publication Data

US 2002/0182873 A1 Dec. 5, 2002

(51) Int. Cl.⁷ ..................... H01L 21/302; H01L 21/461
(52) U.S. Cl. ................. 438/718; 438/945; 438/706
(58) Field of Search .................. 438/46, 945, 718, 438/93, 796, 706

(56) References Cited

U.S. PATENT DOCUMENTS

| 4,595,454 A | | 6/1986 | Dautremont-Smith et al. |
| 4,676,863 A | | 6/1987 | Furuyama et al. |
| 5,316,640 A | | 5/1994 | Wakabayashi et al. |
| 5,372,675 A | * | 12/1994 | Wakabayashi et al. ...... 156/649 |
| 5,866,435 A | | 2/1999 | Park |
| 6,180,429 B1 | * | 1/2001 | Anselm et al. ............... 438/22 |

FOREIGN PATENT DOCUMENTS

| DE | 32 15 410 A1 | | 10/1983 |
| JP | 48056598 A | * | 11/1971 |
| JP | 357183326 A | * | 11/1982 |
| JP | 405013876 A | * | 1/1993 |
| JP | 05 217 995 A | | 8/1993 |
| JP | 05 299 764 | | 11/1993 |
| JP | 06 342 777 | | 12/1994 |

OTHER PUBLICATIONS

P. Wolfram, et al., J. Cryst. Growth, No. 221 (Dec. 2000) pp. 177–182, MOVPE–based in–situ etching of In(GaAs)P/InP using tert butyl chloride.*

K. Imanaka et al.: "A novel technique to fabricate GaInAsP/ InP buried heterostructure laser diodes", Appl. Phys. Lett. vol. 44, No. 10, May 15, 1984, pp. 975–977.

J.R. Lothian et al.: "Mask erosion during dry etching of deep features in III–V semiconductor structures", Semiconductor Science and Technology, vol. 7, No. 9, Sep. 1992, pp. 1199–1209.

P. Wolfram et al.: "MOVPE–based in situ etching of In(GaAs)P/InP using tertiarybutylchloride", Journal of Crystal Growth, No. 221, 2000, pp. 177–182.

R. Gessner et al.: "In–Situ etching of InP based BH Laser Structures in MOVPE", 2001 International Conference on Indium Phosphide and Related Materials Conference Proceedings, 13$^{th}$ IPRM, May 14–18, 2001, Nara, Japan, pp. 398–399.

* cited by examiner

*Primary Examiner*—Caridad Everhart
(74) *Attorney, Agent, or Firm*—Laurence A. Greenberg; Werner H. Stemer; Ralph E. Locher

(57) ABSTRACT

Method of producing a structure for III–V semiconductor components in which a mask is applied to a sample in a masking step, characterized in that at least one mask material is a monocrystalline III–V semiconductor material. This makes possible an easy in-situ removal of the mask from the semiconductor material, which in turn makes possible the growing of additional layers.

17 Claims, 2 Drawing Sheets

IN-SITU MASK TECHNIQUE FOR PRODUCING III-V SEMICONDUCTOR COMPONENTS

BACKGROUND OF THE INVENTION

Field of the Invention

In the production of III–V semiconductor components, masking steps are usually used to structure the surface of a sample. The surface of the sample is partially covered with a mask, for instance a mask made of $SiO_2$ as an amorphous material. The sample material is then removed in the region which is not covered by the mask by an etching step (a dry or wet chemical process).

The term "sample" refers to any material which is structured in the course of manufacturing semiconductor components.

The disadvantage of this procedure is that, in order to remove the $SiO_2$ mask from the surface, the sample must be removed from the epitaxy apparatus, thereby exposing the sample to airborne contaminants and oxygen. The contamination is particularly bad in structures containing aluminum, because this comprises a high bonding affinity to oxygen. Since such structures are highly significant to semiconductor laser production, the contamination is particularly problematic.

SUMMARY OF THE INVENTION

The invention sets forth a method by which it is possible to easily remove the mask from semiconductor material and apply additional layers in-situ in the manufacture of III–V semiconductor components. The method produces a structure for III–V semiconductor components in which a mask is applied to a sample in a masking step, characterized in that at least one mask material is a monocrystalline III–V semiconductor material.

Using a monocrystalline III–V semiconductor material in at least one mask material, it is possible to create a "self-dissolving" mask which is removable from the sample in-situ. The mask is dissolved during etching, which saves a substantial amount of processing time.

It is advantageous if at least one mask material is $Ga_xIn_{1-y}As_yP_{1-y}$ or AlGaInAs. These materials can be removed in a highly controlled fashion by etching the sample.

It is particularly advantageous when the creation of a structure on and/or in the mask, specifically by lithography, is followed by an etching step with tertiary butyl chloride (TBCl) as the etching agent. This etching agent is appreciably milder than the halogenic hydrogen compounds (e.g. HCl) commonly used in in-situ methods. Moreover, the etch rate of this agent is particularly easy to control.

It is advantageous to select the etch rate in the etching step in dependence upon the composition of the mask material, so that the mask is dissolved during etching. A self-dissolving mask can thus be created, in which the etch rate is advantageously precisely selected such that the mask is gone from the sample at the end of the etching step.

The etching step is expediently performed in-situ in the same device in which the structure has been applied in and/or on the sample.

Advantageously, after the etching step at least one epitaxial layer, particularly a guard layer, is applied to the surface. This is also performed in-situ.

The semiconductor component that emerges upon completion of the method can expediently be utilized in a semiconductor laser.

DESCRIPTION OF THE PREFERRED EMBODIMENTS

Figure 1:
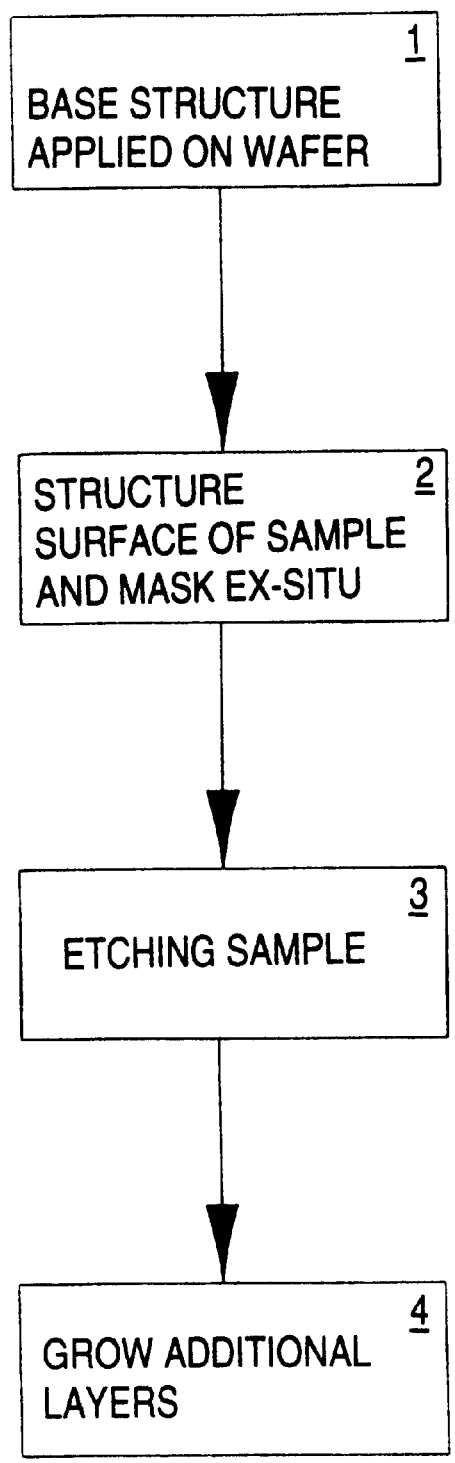
FIG. 1 is a flowchart of an embodiment of the method according to the invention.

The production of semiconductor components by epitaxy and masking is in the prior art. With this in mind, the figures of the drawings are referred to in detail and first, particularly to FIG. 1 thereof, there is shown only the steps that are necessary for describing the invention. A wafer serves as substrate. The substrate with the layer structure of the semiconductor component is referred to as a sample. The mask is disposed over the layer system.

In the first step 1, a component base structure is applied on a wafer by epitaxy. The mask material is also epitaxially applied. This is $Ga_xIn_{1-y}As_yP_{1-y}$ in this case. Alternatively, AlGaInAs can be utilized.

In the second step 2, the surface of the sample and the mask are structured ex-situ by a known technique such as lithography.

In the third step 3, the etching step, a structure on and/or in the sample is etched in the epitaxy apparatus. Tertiary butyl chloride (2-Cl-2-methylpropane; TBCl) is used as the etching gas. TBCl is less aggressive chemically than the customary etching gasses such as hydrochloric acid.

Surprisingly, the etch rate of TBCl in the mask material $Ga_xIn_{1-y}As_yP_{1-y}$ is dependent on the composition of the mask material, i.e. on x and y. This will be described more closely in connection with FIG. 2.

In the present case, the composition of the mask material is selected such that by the end of the etching step 3 the mask material is gone from the sample. Alternatively, the mask material can be removed up to a predeterminable amount.

Because this etching is performed in-situ in the epitaxy apparatus, contamination of the surface is avoided, and valuable processing time is saved.

Next, in a fourth step 4 additional layers are grown over, particularly epitaxial guard layers. This is particularly advantageous given sample materials containing aluminum, because these are particularly sensitive to contamination.

Upon completion of the inventive method, the created semiconductor structure can be utilized in a semiconductor laser.

Figure 2:
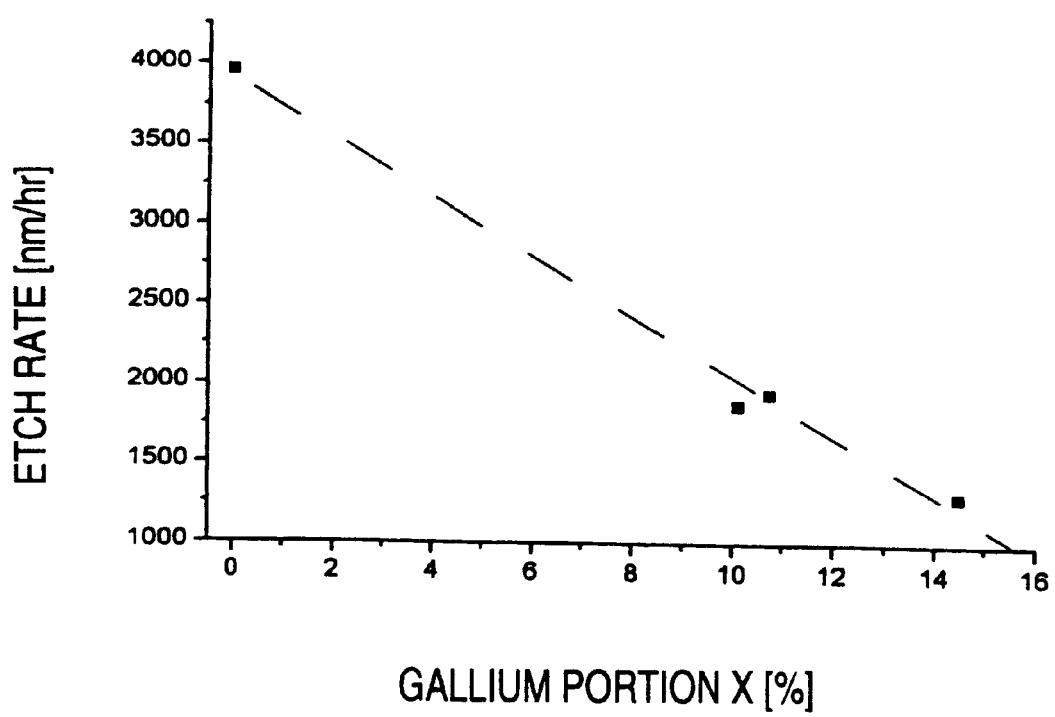
FIG. 2 is a graph illustrating measurement values related to the dependency of the etch rate on the composition of the mask material according to the invention.

FIG. 2 represents measurement values in which the dependency of the etch rate (in nm/hr) is plotted on the ordinate. The gallium portion x in the mask material $Ga_xIn_{1-y}As_yP_{1-y}$ (in %) is plotted on the abscissa. The measurement values were obtained at a temperature of 580° C. given a TBCl flow of $8.2 \times 10^{-5}$ mol/min (without $PH_3$). The hydrogen carrier gas flow amounted to 16 l/min.

It can be recognized in FIG. 2 that a high etch rate is achieved given a low gallium portion. Given a gallium portion of 10%, the etch rate falls to approximately half. An increase to 15% halves this value again. Thus, the etch rate is approximately linearly related to the gallium proportion.

With the aid of a functional dependency such as this, the etch rate can be set such that a mask of predetermined thickness is completely gone from the sample at the conclusion of the etching process. If the etch rate is prescribed, the thickness of the mask material can be specified, accordingly, in order to achieve the same aim.

The invention is not limited in its embodiment to the foregoing preferred exemplifying embodiments. Rather, any number of variations are also imaginable which employ the inventive method and the inventive device in fundamentally different embodiments.

We claim:

1. A method of producing a structure for III–V semiconductor components, which comprises:

applying a mask, having at least one mask material including a monocrystalline III–V semiconductor material, to a sample in a masking step; and selecting an etch rate in an etching step in dependence upon a composition of the at least one mask material for dissolving the mask during the etching step.

2. The method according to claim 1, wherein the at least one mask material includes one of the group consisting of $Ga_xIn_{1-y}As_yP_{1-y}$ and AlGaInAs.

3. The method according to claim 1, which further comprises:

etching with tertiary butyl chloride as an etching agent; and creating a structure at least one of the group consisting of on the mask and in the mask after etching.

4. The method according to claim 1, which further comprises selecting the etch rate for removing the mask from the sample by the end of the etching step.

5. The method according to claim 3, which further comprises:

performing the structure creating step in an apparatus; and performing the etching step in-situ in the apparatus.

6. The method according to claim 3, which further comprises applying at least one epitaxial layer to a surface of the sample following the etching step.

7. The method according to claim 1, which further comprises placing the sample in a semiconductor component.

8. The method according to claim 3, which further comprises carrying out the creating step by creating the structure by lithography.

9. The method according to claim 6, wherein the at least one epitaxial layer is a guard layer.

10. The method according to claim 7, wherein the semiconductor component is a semiconductor laser.

11. A method of producing a component in a semiconductor laser, which comprises:

producing a structure for III–V semiconductor components by applying a mask, having at least one mask material including a monocrystalline III–V semiconductor material, to a sample in a masking step; and selecting an etch rate in an etching step in dependence upon a composition of the at least one mask material for dissolving the mask during the etching step.

12. The method according to claim 11, wherein the at least one mask material includes one of the group consisting of $Ga_xIn_{1-y}As_yP_{1-y}$ and AlGaInAs.

13. The method according to claim 11, which further comprises:

etching with tertiary butyl chloride as an etching agent; and creating a structure at least one of the group consisting of on the mask and in the mask after etching.

14. The method according to claim 11, which further comprises selecting the etch rate for removing the mask from the sample by the end of the etching step.

15. The method according to claim 13, which further comprises:

performing the structure creating step in an apparatus; and performing the etching step in-situ in the apparatus.

16. The method according to claim 13, which further comprises applying at least one epitaxial layer to a surface of the sample following the etching step.

17. A method of producing a structure for III–V semiconductor components, which comprises:

applying a mask to a sample in a masking step, the mask having at least one mask material including a monocrystalline III–V semiconductor material;

etching with tertiary butyl chloride at an etch rate dependent upon a composition of the at least one mask material to dissolve the mask during the etching and remove the mask from the sample by the end of the etching step; and creating a structure at least one of the group consisting of on the mask and in the mask after etching.

* * * * *